United States Patent
Xie (10) Patent No.: US 10,170,631 B2
(45) Date of Patent: Jan. 1, 2019

(54) MANUFACTURING METHODS OF OXIDE THIN FILM TRANSISTORS

(71) Applicant: Wuhan China Star Optoelectronics Technology Co., Ltd., Wuhan, Hubei (CN)

(72) Inventor: Yingtao Xie, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 143 days.

(21) Appl. No.: 15/323,450

(22) PCT Filed: Oct. 9, 2016

(86) PCT No.: PCT/CN2016/101523
§ 371 (c)(1),
(2) Date: Jan. 3, 2017

(87) PCT Pub. No.: WO2018/045612
PCT Pub. Date: Mar. 15, 2018

(65) Prior Publication Data
US 2018/0254349 A1   Sep. 6, 2018

(30) Foreign Application Priority Data
Sep. 8, 2016   (CN) .......................... 2016 1 0808802

(51) Int. Cl.
*H01L 29/786* (2006.01)
*H01L 21/02* (2006.01)
(Continued)

(52) U.S. Cl.
CPC ...... *H01L 29/7869* (2013.01); *H01L 21/0262* (2013.01); *H01L 21/762* (2013.01); *H01L 29/41733* (2013.01); *H01L 29/78696* (2013.01)

(58) Field of Classification Search
CPC ........... H01L 29/7869; H01L 29/78696; H01L 21/0262; H01L 21/762; H01L 29/41733
See application file for complete search history.

(56) References Cited

U.S. PATENT DOCUMENTS

2012/0064665 A1* 3/2012 Yamazaki ......... H01L 21/02422
438/104
2013/0126868 A1* 5/2013 Yamazaki ........... H01L 29/7869
257/57
(Continued)

FOREIGN PATENT DOCUMENTS

CN  1294411 A   5/2001
CN  1340847 A   3/2002
(Continued)

*Primary Examiner* — Karen Kusumakar
(74) *Attorney, Agent, or Firm* — Andrew C. Cheng (57) ABSTRACT

The manufacturing method of oxide thin film transistors (TFTs) includes: providing a substrate and forming an oxide semiconductor active layer on the substrate; depositing an insulation dielectric layer on the active layer; and applying an annealing process to components formed after the insulation dielectric layer is deposited. After depositing the gate insulation layer on the oxide semiconductor active layer, the annealing process is applied to the formed component, which eliminates the difference of the component performance caused by the insulation dielectric layer formed by different film formation processes such that the reproducibility of the film formation processes may be enhanced.

13 Claims, 5 Drawing Sheets

(51) Int. Cl.
*H01L 21/762* (2006.01)
*H01L 29/417* (2006.01)

(56) References Cited

U.S. PATENT DOCUMENTS

| | | | |
|---|---|---|---|
| 2013/0196468 A1* | 8/2013 | Yamazaki | H01L 29/66742 438/104 |
| 2013/0228775 A1* | 9/2013 | Noda | H01L 29/7869 257/43 |
| 2014/0027764 A1* | 1/2014 | Yamazaki | H01L 27/0688 257/43 |
| 2014/0070206 A1* | 3/2014 | Dai | H01L 29/66969 257/43 |
| 2018/0197959 A1* | 7/2018 | Fujita | H01L 21/28 |

FOREIGN PATENT DOCUMENTS

| | | |
|---|---|---|
| CN | 1254948 A | 5/2004 |
| CN | 1504816 A | 6/2004 |
| CN | 1512248 A | 7/2004 |
| CN | 1532945 A | 9/2004 |
| CN | 1355561 A | 6/2006 |
| CN | 1267784 C | 8/2006 |

\* cited by examiner

MANUFACTURING METHODS OF OXIDE THIN FILM TRANSISTORS

BACKGROUND OF THE INVENTION

1. Field of the Invention

The present disclosure relates to semiconductor component manufacturing technology, and more particularly to a manufacturing method of oxide thin film transistors (TFTs), and the oxide TFTs are mainly adopted in array substrates of display devices.

2. Discussion of the Related Art

Flat display devices are characterized by attributes, such as thin, power-saving, no radiation, and thus have been widely adopted. Currently, flat display devices mainly include Liquid Crystal Display (LCD) and Organic Light Emitting Display (OLED). Thin Film Transistor (TFT) is a key component of flat display device, which may be formed on a glass substrate or a plastic substrate. Usually, the TFTs may operate as a lighting device or a driving device, and may be adopted as LCD or OLED.

With respect to display panel industry, the middle-and-large scale trend comes along with the increasing demand toward high resolution, and thus higher demand toward charging and discharging process of semiconductor components of the active layer have been developed. Indium gallium zinc oxide (IGZO) is an amorphous oxide containing indium, gallium, and zinc. The carrier mobility of IGZO is about 20 to 30 times of the carrier mobility of amorphous silicon, and thus is capable of greatly enhancing the charging-discharging rate of the TFT with respect to the pixel electrode. The TFT may be quickly switched by high or low state current, which enhances the response time of the pixels so as to realize high refresh rate. At the same time, the row scanning rate of the pixels may be greatly enhanced so as to realize the high resolution of the display panel.

During the manufacturing process of oxide TFT containing indium, gallium, and zinc, usually, an insulation dielectric layer has to be deposited on the semiconductor active layer. The film formation process of the insulation dielectric layer may greatly affect the oxide. For instance, the H atom generated during the film formation process may enhance the conductive performance of the oxide semiconductor, such as the performance parameters of the TFTs, including threshold voltage. Unstable manufacturing process or parameters may occur during the film formation process, which results in deviation of performance parameters of TFTs. As a result, the uniformity of the components of the array substrate may be affected. Thus, it is critical to reduce the difference between the component performances caused by different film formation process and to enhance the reproducibility of the film formation processes.

SUMMARY

To overcome the above problems, a manufacturing method of oxide TFTs is proposed, which reduces the difference between the components made by different film formation process so as to enhance the reproducibility of the film formation processes.

In one aspect, a manufacturing method of oxide thin film transistors (TFTs) includes: providing a substrate and forming an oxide semiconductor active layer on the substrate; depositing an insulation dielectric layer on the active layer; and applying an annealing process to components formed after the insulation dielectric layer is deposited.

Wherein an environment of the annealing process is full of air, dry oxygen, or wet oxygen, an annealing temperature is in a range from 250 to 450 degrees (Celsius), and a annealing period is in a range from 0.5 to 3 hours.

Wherein a hot-air annealing process or an infrared annealing process is adopted in the annealing process.

Wherein the oxide semiconductor is indium gallium zinc oxide (IGZO).

Wherein the insulation dielectric layer includes at least $SiO_x$ thin layer directly connected to the active layer.

Wherein the insulation dielectric layer further includes a $SiN_x$ thin layer deposited on the $SiO_x$ thin layer.

Wherein the method further includes: S11: providing the substrate and manufacturing a gate electrode on the substrate; S12: depositing the gate insulation layer on the substrate having the gate electrode; S13: forming the oxide semiconductor active layer on the gate insulation layer; S14: forming a source electrode and a drain electrode on the gate insulation layer, and the source electrode and the drain electrode respectively connects to the active layer; S15: depositing a passivation layer on the active layer, and the passivation layer covers the source electrode 15 and the drain electrode, wherein the passivation layer is made by the $SiO_x$; S16: applying an annealing process to the component formed after the passivation layer is deposited.

In another aspect, a manufacturing method of oxide thin film transistors (TFTs) includes: S21: providing a substrate and manufacturing a buffer layer on the substrate; S22: forming an oxide semiconductor active layer on the buffer layer; S23: forming a gate insulation layer on the oxide semiconductor active layer, and the gate insulation layer is made by $SiO_x$; S24: applying an annealing process to the component formed after the gate insulation layer is deposited; S25: forming a gate electrode on the gate insulation layer being applied with the annealing process; S26: forming an inter-layer dielectric (ILD) on the gate electrode, and the ILD covers the buffer layer; S27: etching the ILD to form through holes connecting to the active layer; and S28: forming a source electrode and a drain electrode on the ILD, and the source electrode and the drain electrode connect to the active layer respectively via the through holes.

Wherein step S25 further includes: S251: applying a top-gate self-alignment process to etch metallic-conductive materials to form the gate electrode, and to etch the gate insulation layer below the gate electrode such that the gate insulation layer only covers a middle area of the active layer, and the active layer is exposed by two lateral sides of the gate insulation layer; the source electrode and the drain electrode respectively connect to portions of the active layer exposed by the gate insulation layer.

Wherein step S25 further includes: S252: applying an ion injection process, a plasma bombardment process, or a metallic oxidation process to convert the exposed active layer to be a conductor, one end of the active layer forms a source connection portion, and the other end of the active layer forms a drain connection portion, and the source connection portion connects to the source electrode, and the drain connection portion connects to the drain electrode.

In view of the above, after depositing the gate insulation layer on the oxide semiconductor active layer, the annealing process is applied to the formed component, which eliminates the difference of the component performance caused by the insulation dielectric layer formed by different film formation processes such that the reproducibility of the film formation processes may be enhanced.

DETAILED DESCRIPTION OF THE EMBODIMENTS

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

It is to be noted that, in order to avoid unnecessary detail limiting the claimed invention, the drawings only show structures and/or steps closely related to the proposed solution, and other details may be omitted.

Figure 1:
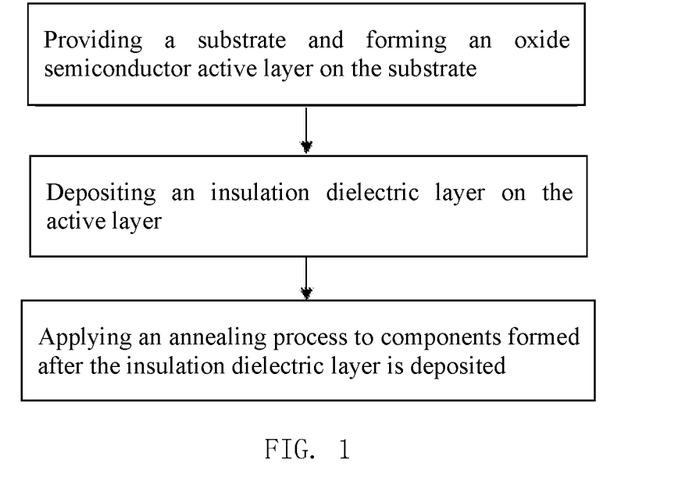
FIG. 1 is a flowchart illustrating the manufacturing method of the oxide TFTs in accordance with one embodiment.

FIG. 1 is a flowchart illustrating the manufacturing method of the oxide TFTs in accordance with one embodiment. The method includes the following steps:

Providing a substrate and forming an oxide semiconductor active layer on the substrate;

Depositing an insulation dielectric layer on the active layer; and

Applying an annealing process to the components formed after the insulation dielectric layer is deposited.

In the manufacturing method, air, dry oxygen, or wet oxygen may be selected to be the condition for applying the annealing process, wherein the annealing temperature may be in a range from 250 to 450 degrees (Celsius), and the annealing period may be in a range from 0.5 to 3 hours.

In the manufacturing method, hot-air annealing process or infrared annealing process may be adopted in the annealing oven.

Wherein the oxide semiconductor may be indium gallium zinc oxide (IGZO).

Wherein the insulation dielectric layer may be a passivation layer on the active layer formed by deposited TFTs of the bottom-gate structure. In another example, the insulation dielectric layer may be a gate insulation layer formed by deposited TFTs of the top-gate structure. The insulation dielectric layer includes at least $SiO_x$ thin layer directly connected to the active layer. In another example, the insulation dielectric layer further includes a $SiN_x$ thin layer deposited on the $SiO_x$ thin layer.

First Embodiment

FIGS. 2a-2e are schematic views showing the manufacturing method of the oxide TFTs in accordance with a first embodiment. The method includes the following steps.

Figure 2A:
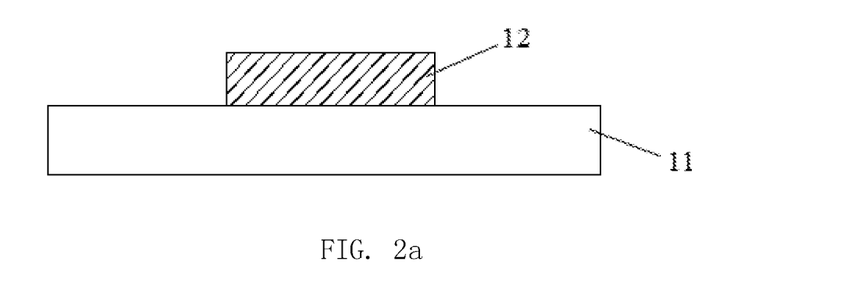
FIGS. 2a-2e are schematic views showing the manufacturing method of the oxide TFTs in accordance with a first embodiment.

In step S11, as shown in FIG. 2a, providing a substrate 11 and manufacturing a gate electrode 12 on the substrate 11. Specifically, the substrate 11 may be a glass substrate, and the gate electrode 12 may be made by metallic-conductive materials. First, a physical vapor deposition (PVD) is adopted to deposit the metallic-conductive thin film on the substrate 11. Afterward, a masking process is adopted to etch the metallic-conductive thin film to be the patterned gate electrode 12.

Figure 2B:
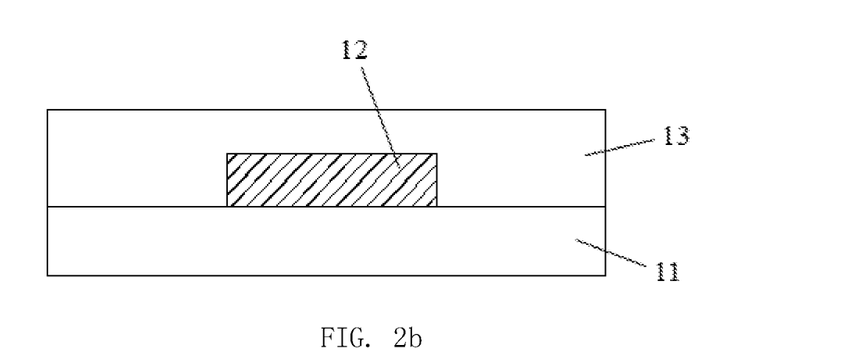

In step S12, as shown in FIG. 2b, depositing a gate insulation layer 13 on the substrate 11 having the gate electrode 12. The gate insulation layer 13 may be made by $SiO_x$ or $SiN_x$. The gate insulation layer 13 may be made by chemical vapor deposition (CVD).

Figure 2C:
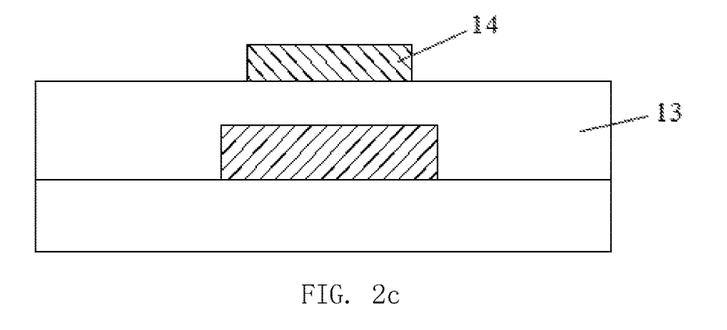

In step S13, as shown in FIG. 2c, forming an oxide semiconductor active layer 14 on the gate insulation layer 13, wherein the oxide semiconductor may be IGZO. Specifically, the PVD is adopted to deposit the IGZO thin film layer on the gate insulation layer 13, and the masking process is adopted to etch the IGZO thin film to be the patterned active layer 14.

Figure 2D:
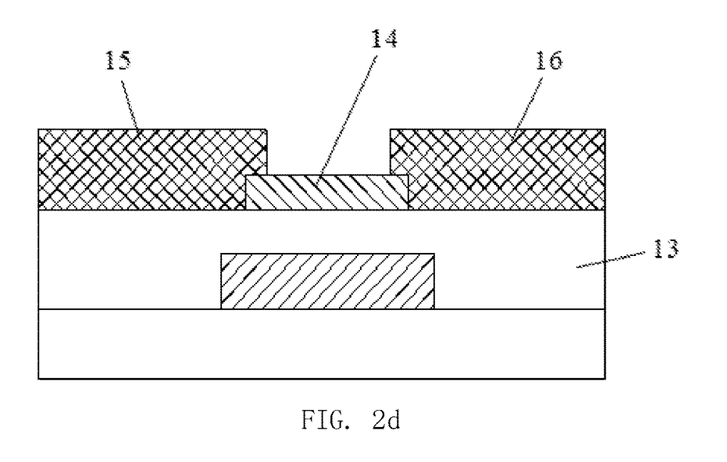

In step S14, as shown in FIG. 2d, forming a source electrode 15 and a drain electrode 16 on the gate insulation layer 13, and the source electrode 15 and the drain electrode 16 respectively connects to the active layer 14. The source electrode 15 and the drain electrode 16 are made by metallic-conductive materials. First, the PVD is adopted to deposit the metallic-conductive thin film. The metallic-conductive covers the active layer 14. Afterward, the masking process is adopted to etch the metallic-conductive thin film to be the patterned source electrode 15 and the drain electrode 16. The source electrode 15 and the drain electrode 16 are spaced apart from each other, and the source electrode 15 and the drain electrode 16 respectively connect to the active layer 14.

Figure 2E:
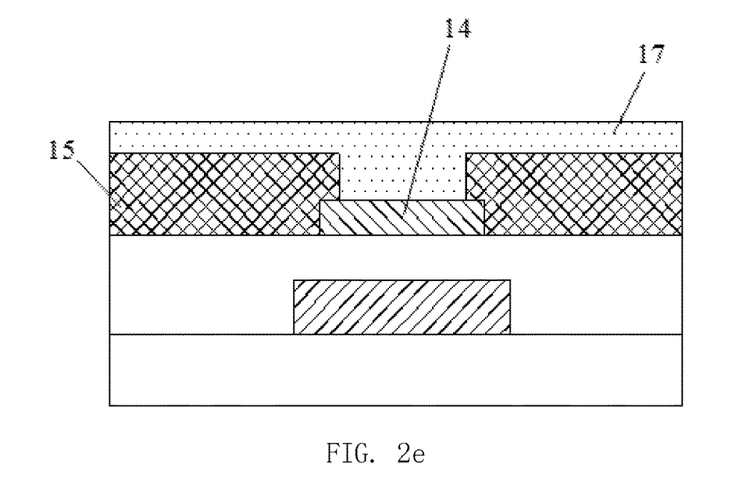

In step S15, as shown in FIG. 2e, depositing a passivation layer 17 on the active layer 14, and the passivation layer 17 covers the source electrode 15 and the drain electrode 16, wherein the passivation layer 17 is made by the silicon oxide. The passivation layer 17 may be obtained by plasma enhanced chemical vapor deposition (PECVD).

In step S16, applying an annealing process to the component formed after the passivation layer 17 is deposited. Specifically, the component is arranged within the annealing oven with the environment having air, and the hot-air annealing process is conducted for one hour with the temperature equaling to 350 degrees (Celsius) to manufacture the oxide TFTs. In other embodiments, the infrared annealing process may be adopted for 0.5 to 3 hours with the temperature in a range from 250 to 450 degrees (Celsius), and the atmosphere may contain dry oxygen or wet oxygen.

Further, if the oxide TFT is adopted in the array substrate of display device, after step S16, an organic-planar layer and at least one pixel electrode are formed on the passivation layer 17 in sequence.

In the above manufacturing processes, each of the masking processes respectively include masking, exposure, development, etching, and stripping, wherein the etching process may include wet and dry etching. It can be understood that the parameters of the masking processes may be different. However, in the LCD manufacturing field, the masking process is mature technology, and thus the corresponding descriptions are omitted hereinafter.

Two manufactured samples are compared to obtain the data shown in Table. 1, so as to illustrate the technical effects of the claimed invention.

TABLE 1

| | First Set | | | Second Set | | |
|---|---|---|---|---|---|---|
| | Sample | | | | | |
| | Sample 1 | Sample 2 | Sample 3 | Sample 4 | Sample 5 | Sample 6 |
| Mobility | 11.53 | 14.57 | 69.51 | 13.08 | 12.67 | 11.84 |
| Vth | 6.61 | 3.24 | −22.7 | 1.64 | 1.29 | 1.65 |
| SS | 0.49 | 2.42 | 4.30 | 0.43 | 1.27 | 1.14 |

In view of Table. 1, Mobility relates to a mobility rate of the sample (TFT), Vth relates to the threshold voltage of the sample, and SS relates to the subthreshold swing of the sample.

Wherein Samples 1, 2, and 3 in the first set are obtained by the manufacturing process in the above embodiments, however, the annealing process is excluded, that is, step 16 is excluded. The parameters regarding step 15 are different with respect to sample 1, 2, and 3. That is, when step 15 is conducted, the parameters including chamber pressure, gas flow, and other parameters are the same, but the power of the device is configured to be 1400 W to manufacture the sample 1, the power of the device is configured to be 1000 W to manufacture the sample 2, and the power of the device is configured to be 600 W to manufacture the sample 3.

Wherein Samples 4, 5 and 6 in the second set are obtained by the manufacturing process in the above embodiments, that is, compared to the samples in the first set, the annealing process is included. The parameters regarding the depositing of the passivation layer may be different with respect to samples 4, 5 and 6. That is, when step 15 is conducted, the parameters including chamber pressure, gas flow, and other parameters are the same, but the power of the device is configured to be 1400 W to manufacture the sample 4, the power of the device is configured to be 1000 W to manufacture the sample 5, and the power of the device is configured to be 600 W to manufacture the sample 6.

In view of Table. 1, after depositing the passivation layer on the oxide semiconductor active layer, the annealing process is excluded from the manufacturing process of the samples in the first set. The threshold voltage (Vth) of the samples is greater, and the difference between the threshold voltages of the samples are greater also. Further, the subthreshold swing between the samples are greater, which illustrates the performance of the components may be much different when the passivation layer is formed by different film formation processes. With respect to the samples in the second set being applied with the annealing process, the threshold voltage of the samples is close to zero. The difference between the threshold voltages between the samples is also smaller. In addition, the subthreshold swing between the samples are smaller, which illustrates that the difference of the performance of the components made by different film formation processes may be greatly reduced such that the reproducibility of the film formation processes may be enhanced.

Second Embodiment

FIGS. 3a-3h are schematic views showing the manufacturing method of the oxide TFTs in accordance with a second embodiment. The method includes the following steps.

Figure 3A:
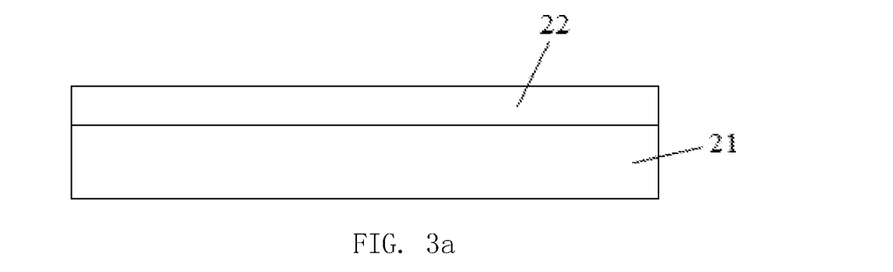
FIGS. 3a-3h are schematic views showing the manufacturing method of the oxide TFTs in accordance with a second embodiment.

In step S21, as shown in FIG. 3a, providing a substrate 21 and manufacturing a buffer layer 22 on the substrate 21. The buffer layer 22 may be made by $SiO_x$ via CVD.

Figure 3B:
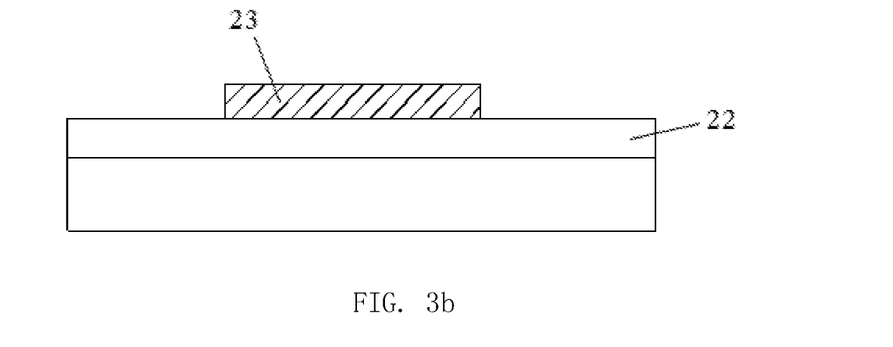

In step S22, as shown in FIG. 3b, forming an oxide semiconductor active layer 23 on the buffer layer 22, wherein the oxide semiconductor may be IGZO. Specifically, the PVD is adopted to deposit the IGZO thin film layer on the buffer layer 22, and the masking process is adopted to etch the IGZO thin film to be the patterned active layer 23.

Figure 3C:
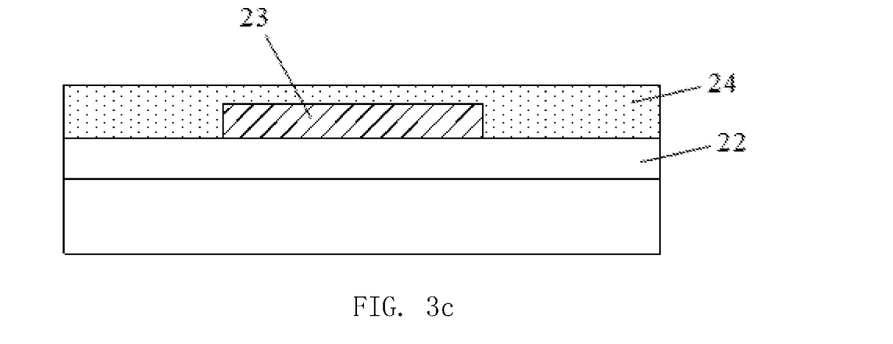

In step S23, as shown in FIG. 3c, forming a gate insulation layer 24 on the semiconductor active layer 23. The gate insulation layer 24 may be made by $SiO_x$. The gate insulation layer 24 may be made by CVD.

In step S24, applying an annealing process to the component formed after the gate insulation layer 24 is deposited. Specifically, the component is arranged within the annealing oven with the environment having air, and the hot-air annealing process is conducted for one hour with the temperature equaling to 350 degrees (Celsius) to manufacture the component (TFT). In other embodiments, the infrared annealing process may be adopted for 0.5 to 3 hours with the temperature in a range from 250 to 450 degrees (Celsius), and the atmosphere may contain dry oxygen or wet oxygen.

Figure 3D:
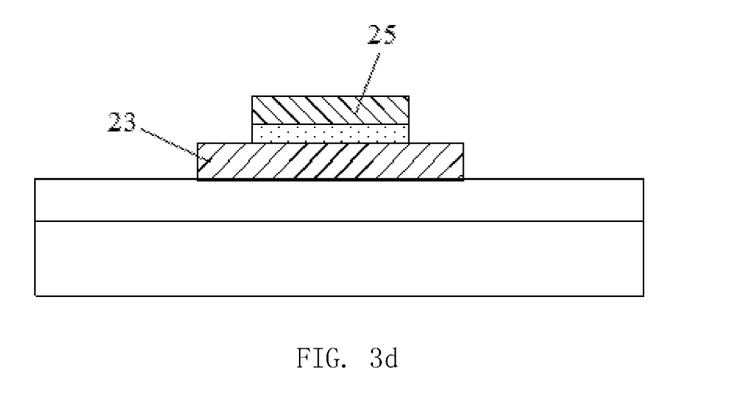

In step S25, as shown in FIG. 3d, forming a gate electrode 25 on the gate insulation layer 24 being applied with the annealing process, wherein the gate electrode 25 may be made by metallic-conductive materials. First, the PVD is adopted to deposit the metallic-conductive thin film on the gate insulation layer 24. Afterward, a masking process is adopted to etch the metallic-conductive thin film to be the patterned gate electrode 25.

In the embodiment, the method further includes the following steps:

In step S251, as shown in FIG. 3d, applying a top-gate self-alignment process to etch the metallic-conductive materials to form the gate electrode 25, and to etch the gate insulation layer 24 below the gate electrode 25 such that the gate insulation layer 24 only covers a middle area of the active layer 23, and the active layer 23 is exposed by two lateral sides of the gate insulation layer 24.

Figure 3E:
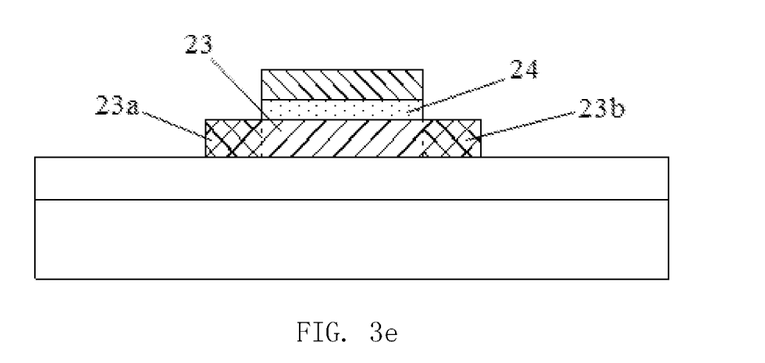

In step S252, as shown in FIG. 3e, applying an ion injection process, a plasma bombardment process, or a metallic oxidation process to convert the exposed active layer 23 to be a conductor. As such, one end of the active layer 23 forms a source connection portion 23a, and the other end of the active layer 23 forms a drain connection portion 23b.

Figure 3F:
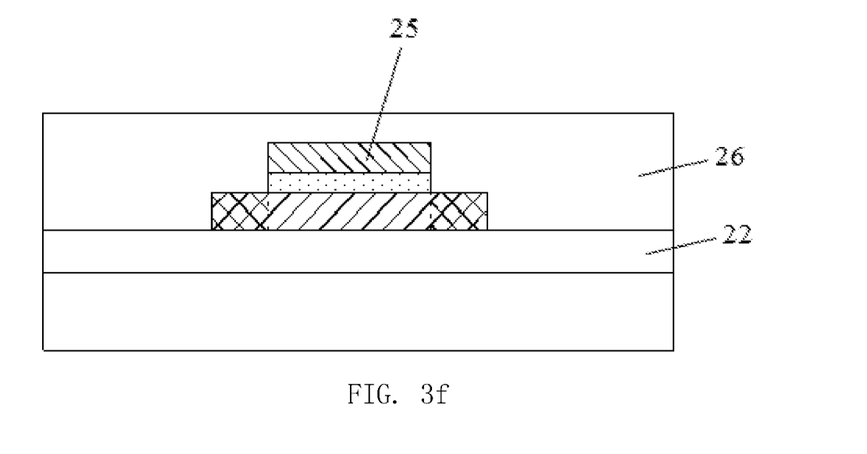

In step S26, as shown in FIG. 3f, forming an inter-layer dielectric (ILD) 26 on the gate electrode 25, and the ILD 26 covers the buffer layer 22. The ILD 26 may be made by $SiO_x$ or $SiN_x$. The ILD 26 may be formed by CVD.

Figure 3G:
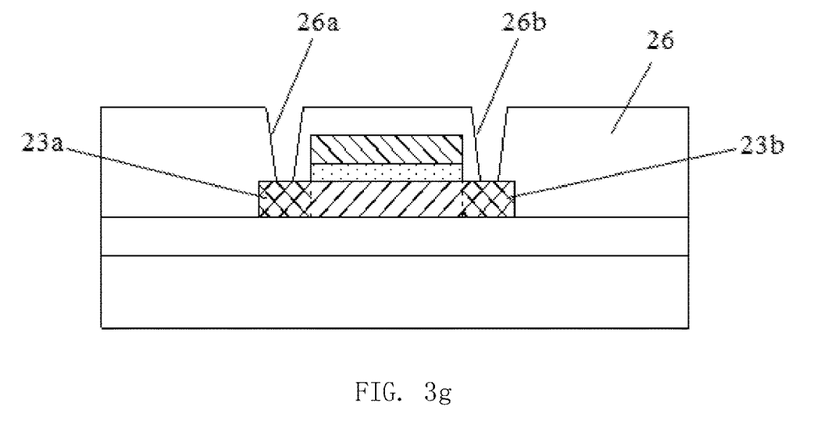

In step S27, as shown in FIG. 3g, etching the ILD 26 to form through holes 26a, 26b connecting to the active layer 23. Specifically, the masking process is adopted to form the through holes 26a, 26b. The through hole 26a connects to the source connection portion 23a, and the through hole 26b connects to the drain connection portion 23b.

Figure 3H:
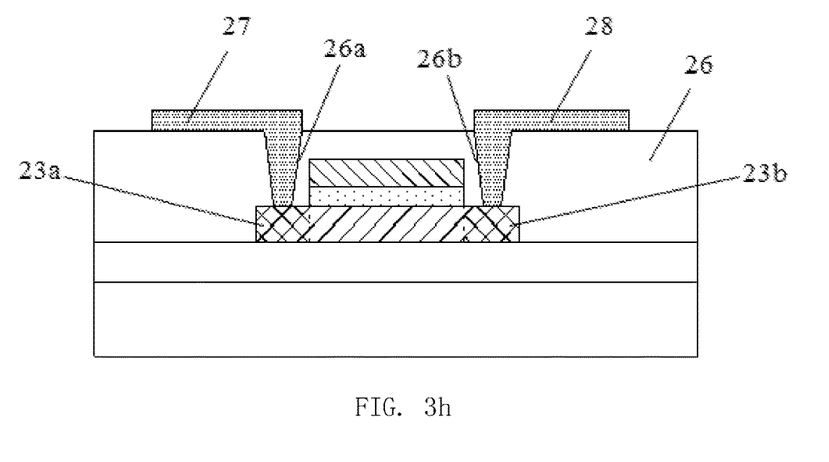

In step S28, as shown in FIG. 3h, forming a source electrode 27 and a drain electrode 28 on the ILD 26. The source electrode 27 and the drain electrode 28 connect to the active layer 23 respectively via the through holes 26a, 26b to complete the manufacturing process of the oxide TFTs, wherein the source electrode 27 and the drain electrode 28 are made by metallic-conductive materials. First, the PVD is adopted to deposit the metallic-conductive thin film on the ILD 26. Afterward, the masking process is adopted to etch the metallic-conductive thin film to form the patterned source electrode 27 and the drain electrode 28. The source electrode 27 and the drain electrode 28 are spaced apart from each other. The source electrode 27 connects to the source connection portion 23a via the through hole 26a, and the drain electrode 28 connects to the drain connection portion 23b via the through hole 26b. In view of the above structure, the source connection portion 23a, the drain connection portion 23b, and the active layer 23 are on the same layer, and are integrally formed. In addition, the source connection portion 23a and the drain connection portion 23b have great conductive performance. Thus, when the source electrode 27 and the drain electrode 28 connects to the active layer 23 via the source connection portion 23a and the drain connection portion 23b, the contact resistance between the source electrode 27, the drain electrode 28, and the active layer 23 are decreased, such that the performance of the component may be enhanced.

Further, if the oxide TFT is adopted in the array substrate of display device, after step S28, an organic-planar layer and at least one pixel electrode are formed on the ILD 26 in sequence.

In the above manufacturing processes, each of the masking processes respectively include masking, exposure, development, etching, and stripping, wherein the etching process may include wet and dry etching. It can be understood that the parameters of the masking processes may be different. However, in the LCD manufacturing field, the masking process is mature technology, and thus the corresponding descriptions are omitted hereinafter.

In view of the above, after depositing the gate insulation layer on the oxide semiconductor active layer, the annealing process is applied to the formed component, which eliminates the difference of the component performance caused by the insulation dielectric layer formed by different film formation processes such that the reproducibility of the film formation processes may be enhanced.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:
1. A manufacturing method of oxide thin film transistors (TFTs), comprising:
    providing a substrate and forming an oxide semiconductor active layer on the substrate;
    depositing an insulation dielectric layer on the active layer;
    applying an annealing process to components formed after the insulation dielectric layer is deposited;
    wherein the insulation dielectric layer comprises at least $SiO_x$ thin layer directly connected to the active layer; and
    wherein the insulation dielectric layer further comprises a $SiN_x$ thin layer deposited on the $SiO_x$ thin layer.

2. The manufacturing method of oxide TFTs as claimed in claim 1, wherein an environment of the annealing process is full of air, dry oxygen, or wet oxygen, an annealing temperature is in a range from 250 to 450 degrees (Celsius), and a annealing period is in a range from 0.5 to 3 hours.

3. The manufacturing method of oxide TFTs as claimed in claim 2, wherein a hot-air annealing process or an infrared annealing process is adopted in the annealing process.

4. The manufacturing method of oxide TFTs as claimed in claim 1, wherein the oxide semiconductor is indium gallium zinc oxide (IGZO).

5. The manufacturing method of oxide TFTs as claimed in claim 1, wherein the method further comprises:
    S11: providing the substrate and manufacturing a gate electrode on the substrate;
    S12: depositing the gate insulation layer on the substrate having the gate electrode;
    S13: forming the oxide semiconductor active layer on the gate insulation layer;
    S14: forming a source electrode and a drain electrode on the gate insulation layer, and the source electrode and the drain electrode respectively connects to the active layer;
    S15: depositing a passivation layer on the active layer, and the passivation layer covers the source electrode 15 and the drain electrode, wherein the passivation layer is made by the $SiO_x$;
    S16: applying an annealing process to the component formed after the passivation layer is deposited.

6. A manufacturing method of oxide thin film transistors (TFTs), comprising:
    S21: providing a substrate and manufacturing a buffer layer on the substrate;
    S22: forming an oxide semiconductor active layer on the buffer layer;
    S23: forming a gate insulation layer on the oxide semiconductor active layer, and the gate insulation layer is made by $SiO_x$;
    S24: applying an annealing process to the component formed after the gate insulation layer is deposited;
    S25: forming a gate electrode on the gate insulation layer being applied with the annealing process;
    S26: forming an inter-layer dielectric (ILD) on the gate electrode, and the ILD covers the buffer layer;
    S27: etching the ILD to form through holes connecting to the active layer; and
    S28: forming a source electrode and a drain electrode on the ILD, and the source electrode and the drain electrode connect to the active layer respectively via the through holes.

7. The manufacturing method of oxide TFTs as claimed in claim 6, wherein step S25 further comprises:
    S251: applying a top-gate self-alignment process to etch metallic-conductive materials to form the gate electrode, and to etch the gate insulation layer below the gate electrode such that the gate insulation layer only covers a middle area of the active layer, and the active layer is exposed by two lateral sides of the gate insulation layer; the source electrode and the drain electrode respectively connect to portions of the active layer exposed by the gate insulation layer.

8. The manufacturing method of oxide TFTs as claimed in claim 7, wherein step S25 further comprises:
- S252: applying an ion injection process, a plasma bombardment process, or a metallic oxidation process to convert the exposed active layer to be a conductor, one end of the active layer forms a source connection portion, and the other end of the active layer forms a drain connection portion, and the source connection portion connects to the source electrode, and the drain connection portion connects to the drain electrode.

9. The manufacturing method of oxide TFTs as claimed in claim 6, wherein an environment of the annealing process is full of air, dry oxygen, or wet oxygen, an annealing temperature is in a range from 250 to 450 degrees (Celsius), and a annealing period is in a range from 0.5 to 3 hours.

10. The manufacturing method of oxide TFTs as claimed in claim 9, wherein a hot-air annealing process or an infrared annealing process is adopted in the annealing process.

11. The manufacturing method of oxide TFTs as claimed in claim 6, wherein the oxide semiconductor is indium gallium zinc oxide (IGZO).

12. The manufacturing method of oxide TFTs as claimed in claim 6, wherein the insulation dielectric layer comprises at least $SiO_x$ thin layer directly connected to the active layer.

13. The manufacturing method of oxide TFTs as claimed in claim 12, wherein the insulation dielectric layer further comprises a $SiN_X$ thin layer deposited on the $SiO_x$ thin layer.

* * * * *